United States Patent
Yildiz et al.

(10) Patent No.: US 7,362,185 B1
(45) Date of Patent: Apr. 22, 2008

(54) ANALOG BASED, STATE MACHINE CONTROLLED, FREQUENCY SMOOTH SWITCHING METHOD FOR FREQUENCY TIMING GENERATORS

(75) Inventors: Aysel Yildiz, Istanbul (TR); Gregory Richmond, Sunnyvale, CA (US); Arda Kamil Bafra, Istanbul (TR)

(73) Assignee: Cypress Semiconductor Corporation, Jose, CA (US)

( * ) Notice: Subject to any disclaimer, the term of this patent is extended or adjusted under 35 U.S.C. 154(b) by 0 days.

(21) Appl. No.: 11/342,229

(22) Filed: Jan. 26, 2006

Related U.S. Application Data

(60) Provisional application No. 60/648,074, filed on Jan. 27, 2005.

(51) Int. Cl.
*H03L 7/08* (2006.01)
(52) U.S. Cl. .............................. 331/17; 331/16; 331/25; 327/157
(58) Field of Classification Search ................... 331/14, 331/17, 18, 25, 1 A, 177 R; 327/156, 157
See application file for complete search history.

(56) References Cited

U.S. PATENT DOCUMENTS

| | | | | |
|---|---|---|---|---|
| 5,351,015 A | * | 9/1994 | Masumoto et al. | ......... 331/1 R |
| 6,100,767 A | * | 8/2000 | Sumi | ............................ 331/11 |
| 7,132,897 B2 | * | 11/2006 | Hofmann | ...................... 331/16 |
| 2003/0001681 A1 | * | 1/2003 | Asikainen et al. | ............ 331/18 |

* cited by examiner

*Primary Examiner*—Robert J. Pascal
*Assistant Examiner*—Ryan J Johnson

(57) ABSTRACT

A method and circuit for performing switching in a frequency timing generator is described. The method includes detecting a request for a new value for a feedback counter or an reference counter, upon which a loading operation is synchronized for the appropriate counter. A time-out order of the feedback counter and the reference counter is determined. Where no time-out order difference is detected therein, a state machine status word function is completed. Where a time-out order difference is detected therein, it is determined which of the reference counter and the feedback counter times out first. Where the reference counter times out first, a constant charge pump current is delivered to a loop filter associated with a phase locked loop to achieve an upward frequency direction. Where the feedback counter times out first, a constant charge pump current is delivered to the loop filter to achieve a downward frequency direction.

19 Claims, 4 Drawing Sheets

IMPROVED METHOD FOR FREQUENCY SMOOTH SWITCHING

CONVENTIONAL FREQUENCY SWITCHING METHOD FOR FREQUENCY TIMING GENERATORS.

IMPROVED METHOD FOR FREQUENCY SMOOTH SWITCHING

ANALOG BASED, STATE MACHINE CONTROLLED, FREQUENCY SMOOTH SWITCHING METHOD FOR FREQUENCY TIMING GENERATORS

RELATED U.S. APPLICATION

This application claims priority to U.S. Provisional Patent Application Ser. No. 60/648,074 entitled Analog Based, State Machine Controlled, Frequency Smooth Switching Method for Frequency Timing Generators, by Aysel Yildiz, Gregory Richmond and Arda Kamil Bafra, filed on Jan. 27, 2005 and assigned to the assignee of the present application. To the extent not repeated herein, this related application is incorporated by reference.

TECHNOLOGY

The present invention relates generally to electronics. More particularly, embodiments of the present invention relate to frequency switching circuits and methods operable in frequency timing generator devices.

BACKGROUND

Frequency Timing Generator (FTG) integrated circuit (IC) devices, e.g., "chips," are widely used in the electronics industry. A conventional phase lock loop (PLL) frequency timing generator device is shown in FIG. 1. The frequency timing generator device of FIG. 1 comprises a comparator and up/down counter feeding an M-counter and an N-counter. The M-counter and N-counter is coupled to the input of a phase/frequency divider, which is coupled to the input of a charge pump, which is coupled to the input of a loop filter, which is coupled to the input of a voltage controlled oscillator (VCO). The output of the VCO is fed back to the input of the N-counter, forming a feedback loop. A reference frequency Fref is coupled to the input of the M-counter.

In FTG devices, different frequency output selections may be chosen, and are usually listed in a frequency table. A default frequency selection table is typically supplied with most FTG devices, but many users prefer to generate their own frequency outputs by programming M and N dividers in the PLL. This is sometimes referred to as dial-a-frequency (DAF) feature. A new frequency may be programmed either through selection from frequency table (e.g., with hardware) or with a System Management Bus (SMBUS). SMBUS effectively comprises a serial data interface, similar in some respects to I1C compliant interfaces.

To enhance the flexibility and function of the clock synthesizer, a two wire serial interface is provided in the FTGs. Through this interface, various device functions can be programmed. Such functions can include frequency selection using, e.g., the FTG frequency table or DAF. Once a new frequency is programmed, the output frequency transitions its behavior from the original frequency to the target frequency. This transition is called frequency switching. Typically, smoothness is a desirable attribute of frequency switching.

A conventional frequency smooth switching algorithm relies on detecting the new values of dividers (e.g., higher-lower-equal) via a comparator and step-by-step increments or decrements of M (reference divider) and N (feedback divider) counters until target M and N values are reached. The slew rate of each step depends on the loop bandwidth for the N value of that step. In order to support all frequency selections of the FTG, the VCO of the PLL should work at its linear region for a maximum and minimum frequencies without stability related issues. This typically requires a VCO with a gain value KVCO, which is stated in units of Megahertz per Volt (MHz/V), and a charge pump (ICP) current with a loop filter configuration (resistor R1, capacitor C1, capacitor C2 as shown in the FIG. 2).

As the frequency range of the PLL increases, the bandwidth (proportional to KVCO, ICP and R1 of the loop filter) increases. This increase in bandwidth also increases the frequency transition slew rate that should be limited for FTGs, which allows systems using the FTGs to correctly follow the output frequency. Some modern FTG circuits are designed to achieve a maximum slew rate that is less than 300 kHz per microsecond (300 KHz/µs). However, control of the slew rate during transition can be difficult for conventional solutions to achieve. Further, the transitions characterizing conventional solutions is substantially non-linear.

DAF features typically rely on programming both M and N dividers, which can be programmed simultaneously or one at a time, depending on the target frequency. The VCO output frequency equals the reference frequency multiplied by the value of N divided by M. The target frequency is directly proportional to the N divider value, and inversely proportional to the M-divider value.

Conventional circuits change one divider at a time and conventional switching methods give priority to decreasing frequency outputs. Thus conventionally, when both the M-divider and N-divider values are programmed, priority is given to either the M or N divider depending on which one decreases the frequency first. The remaining divider is modified later to further decrease or increase the frequency depending on programmed value.

In the situation where both dividers are modified for a higher frequency, there may arise a situation, for example, where the original M and N values are (M, N)=(39, 208), resulting in the Fvco=800 Mhz (Fref=150 MHz). Where the target M and N values are (M, N)=(42, 226) the resulting Fvco=807 Mhz. In the conventional circuit, this selection causes the M divider to change first from 39 to 42 (step-by-step) decreasing Fvco=742 Mhz and then N changes one by one from 208 to 226 and the target frequency is reached (807 Mhz). Even though the difference between the target and the original frequency is close (7 Mhz only) the conventional method requires a dip of 65 Mhz first followed by an 84 Mhz increase. This can be inefficient and can increase the transition time and the power required.

Conventional switching solutions attempt to smooth a switching block using a 'step' approach. The total frequency switch from the starting frequency to the final frequency comprises frequency steps where the M or N value was increased or decreased by one at each increment as appropriate to reach the target frequency. In the conventional solution when the values of the M divider and N divider are both changed together, one is changed before the other. This can result in unnecessary frequency dips when both the M divider and N divider are changed by large amounts even though frequency stayed close to the starting point.

Thus, conventional solutions demand that new M and N values be changed one by one and must approach their target values in a step-by-step manner. This can increase the time it takes to reach the target frequency. Further, in conventional solutions the slew rate is controlled by the bandwidth (BW) of the PLL and may be too high (e.g., out of specifications) for high frequency PLLs, such as those used in some more modern FTG applications. Moreover, resources such as the number of gates and/or die area required to perform the step-by-step conventional behavior tend to be costly, time required for simulation and verification can be significant, and thus conventional solutions can be expensive in several ways.

SUMMARY

Accordingly, it is desirable to control the frequency transition slew rate, reduce the total transition time and reduce the demanded gate count for the smooth switching that is required for the FTGs supporting configurable (e.g., DAF) frequency and electromagnetic interference (EMI) reduction features.

A method and circuit for performing switching in a frequency timing generator are disclosed. The frequency transition slew rate is controlled and total transition time is reduced. Also reduced are the demanded gate count for smooth switching that is needed for FTGs supporting DAF and other configurable frequency and EMI reduction features.

In one embodiment, the novel method includes detecting a request for a new value for a feedback counter or an reference counter, upon which a loading operation is synchronized for the appropriate counter. A time-out order of the feedback counter and the reference counter is determined. Where no time-out order difference is detected therein, a state machine status word function is completed. Where a time-out order difference is detected therein, it is determined which of the reference counter and the feedback counter times out first. Where the reference counter times out first, a constant charge pump current is delivered to a loop filter associated with a phase locked loop to achieve an upward frequency direction. Where the feedback counter times out first, a constant charge pump current is delivered to the loop filter to achieve a downward frequency direction. Following providing a constant charge pump current for up or down direction, it is determined whether the time-out order is changed from the original order, and then lock state detected and state machine status word function is completed.

DETAILED DESCRIPTION

Figure 1:
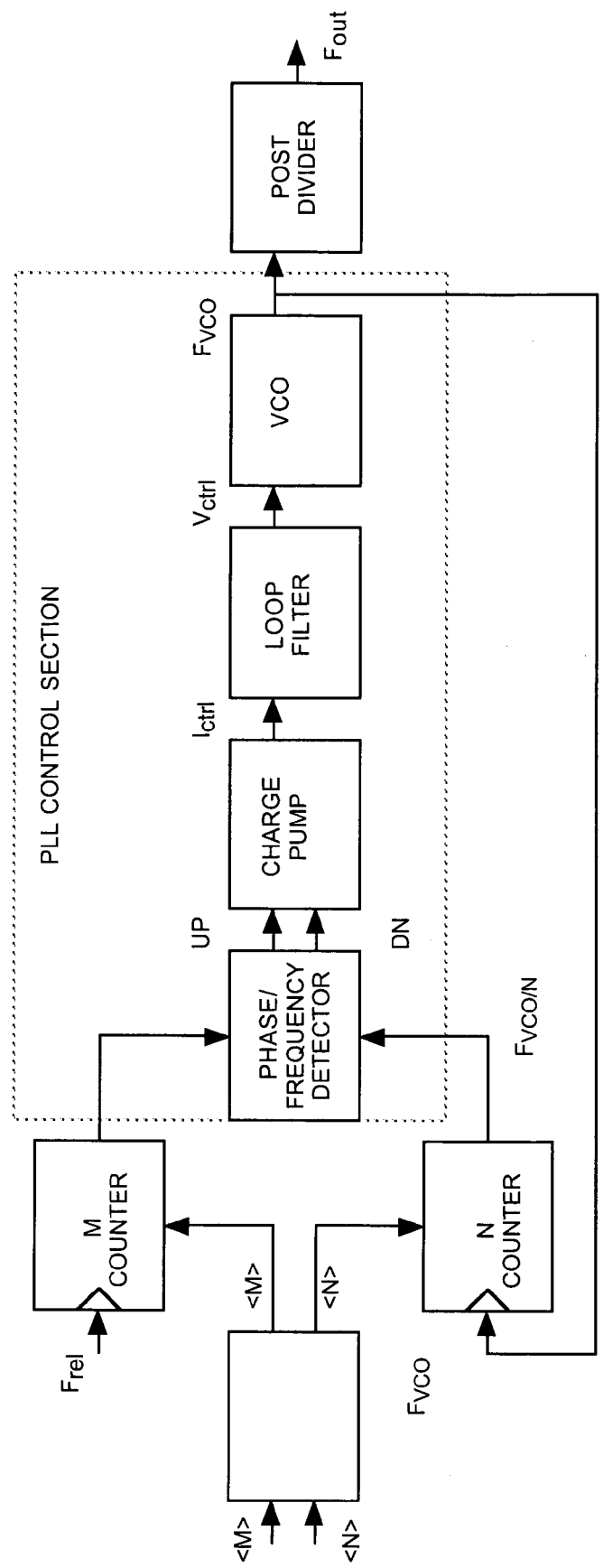
FIG. 1 depicts a conventional frequency switching method for Frequency Timing Generators.

Exemplary embodiments of a method and circuit for performing smooth switching in a frequency timing generator are described. Reference is now made in detail to several embodiments of the invention, examples of which are illustrated in the accompanying drawing figures. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, one of ordinary skill in the art will realize that embodiments of the present invention may be practiced without these specific details. In other instances, well-known methods, processes, algorithms, procedures, networks, systems, components, and circuits have not been described in detail so as not to unnecessarily obscure aspects of the present invention.

Portions of the detailed description that follows are presented and discussed in terms of processes. Although steps and sequencing thereof are disclosed in a figure herein (e.g., FIG. 3) describing the operations of these processes (e.g., process 300), such steps and sequencing are exemplary. Embodiments of the present invention are well suited to performing various other steps or variations of the steps recited in the flowcharts of the figures herein, and in a sequence other than that depicted and described herein. In one embodiment, such processes are carried out by processors and electrical and electronic components under the control of computer readable and computer executable instructions comprising code contained in a computer usable medium.

Embodiments of the present invention provide a method and circuit for performing smooth switching in a frequency timing generator. In one embodiment, the method includes detecting a request for a new value for a feedback counter or an reference counter, upon which a loading operation is synchronized for the appropriate counter. A time-out order of the feedback counter and the reference counter is determined. Where no time-out order difference is detected therein, a state machine status word function is completed. Where a time-out order difference is detected therein, it is determined which of the reference counter and the feedback counter times out first. Where the reference counter times out first, a constant charge pump current is delivered to a loop filter associated with a phase locked loop to achieve an upward frequency direction. Where the feedback counter times out first, a constant charge pump current is delivered to the loop filter to achieve a downward frequency direction.

Therefore, methods and circuits for performing switching in a frequency timing generator are provided in which the frequency transition slew rate is controlled and total transition time is reduced. Advantageously, also reduced are the demanded gate count for smooth switching that is needed for FTGs supporting DAF and other configurable frequency and EMI reduction features.

Figure 2:
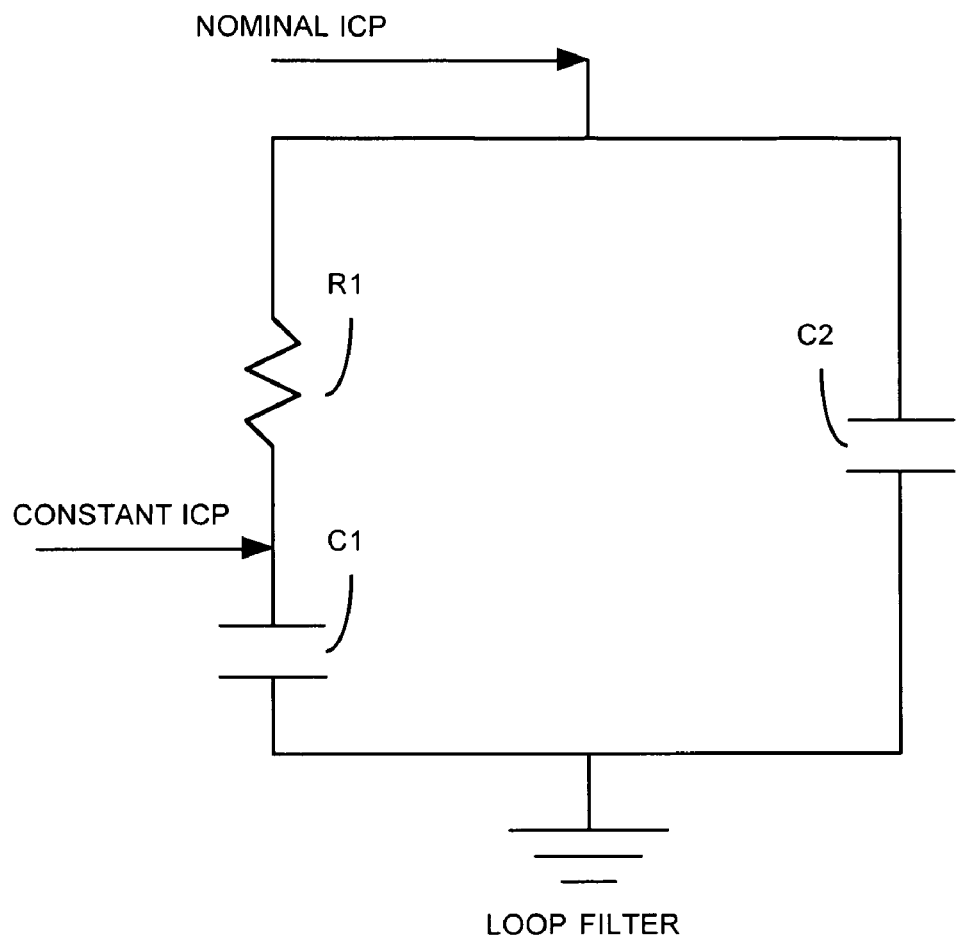
FIG. 2 is an improved circuit for frequency smooth switching, according to an embodiment of the present invention.

An embodiment of an improved circuit and method for frequency smooth switching is shown in FIG. 2. The loop filter shown in FIG. 2 is for a type-II PLL, which is defined as having two poles at the origin with a second order loop filter. A second order loop filter comprises a resistor, R1, in series with capacitor, C1, then in parallel with a smaller capacitor C2, C1, and R1 provide stability for the loop while C2 is used to reduce voltage ripple on the loop filter voltage.

In normal operation, there is no frequency switching in the locked state. In normal operation, the traditional structure uses the charge pump current applied between the R1 and C2 and the duration of the charge pump current application depends on the phase error between the sampling clock (Fref/M) and feedback clock (Fref/N). During the transition, e.g., the frequency switching step, the phase detector is disabled, the nominal ICP is not applied (0 uA)

and instead, a constant charge pump current ICP is applied between the larger capacitor (C1) and R1. The ICP has a duration equal to the transition time from original frequency to the target frequency and direction depending on whether frequency is increasing or decreasing. This generates a linear transition to the target frequency.

Figure 3:
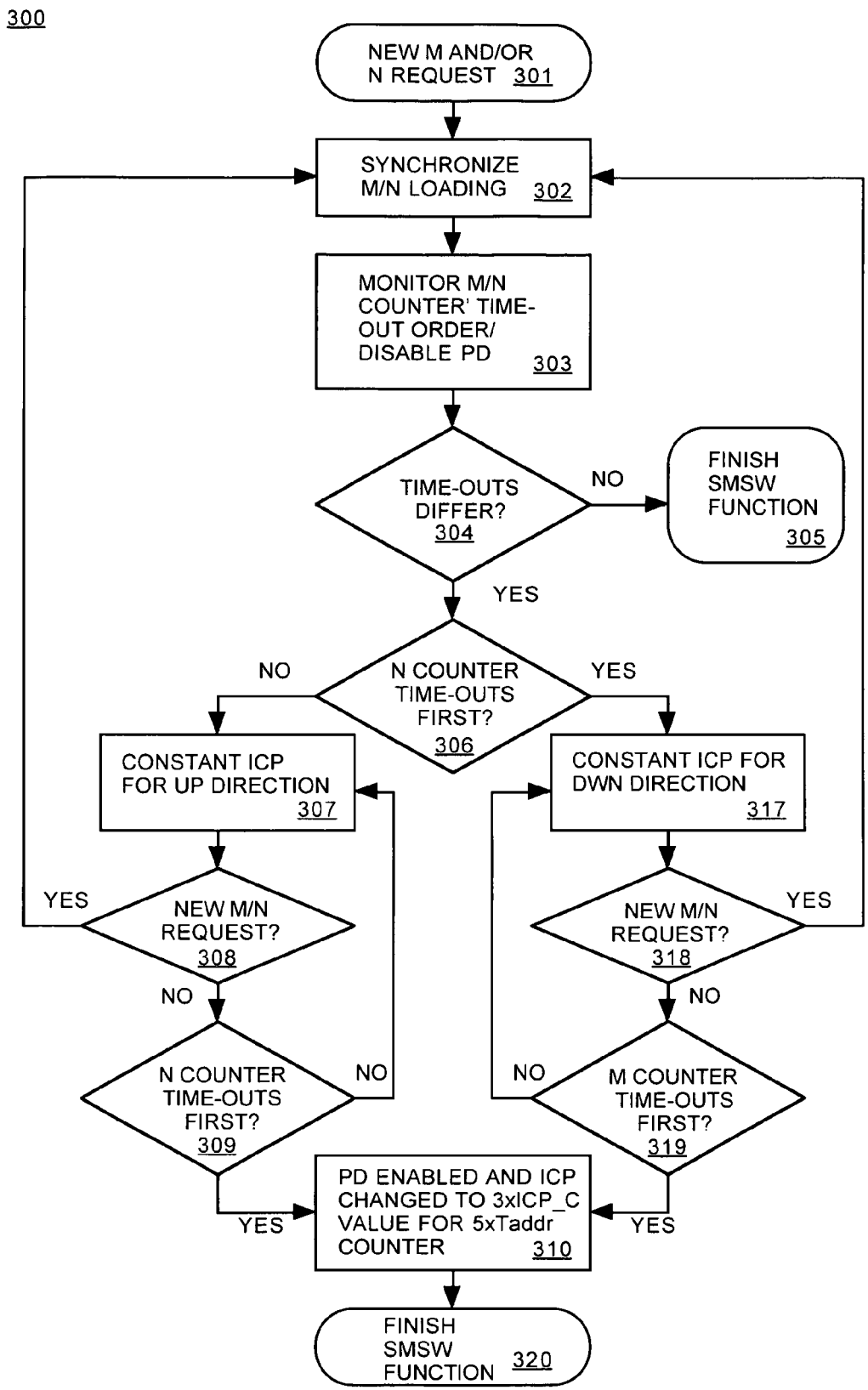
FIG. 3 is an improved method for frequency smooth switching, according to an embodiment of the present invention.

FIG. 3 shows a flowchart for an improved method of for frequency smooth switching. The improved method shown in FIG. 3 comprises a state machine configurable to synchronize the loading of new M and N counter values when they are programmed. The state machine has a plurality of states. A first state detects whether switching is required or not by checking the time out order of the counters. A second state detects the switching direction for the target frequency by checking the time-out orders of the counters. A third state opens the PLL loop by disabling the phase detector if switching required. A fourth state enables the constant current to be applied to bigger capacitor in the loop to allow linear transition to the target frequency. A fifth state detects if the target frequency is reached by checking the time out order of the counters again.

Glue logic is used to perform the interfacing operation between the state machine and the M counter and N counter, and the phase detector and the analog circuit that generates charge pump current. In the improved loop filter, the charge pump circuit is configurable to use both traditional charge pump current to the loop filter during lock state (normal operation) or a constant current to the larger cap of the loop while frequency switching occurs.

Unlike the conventional old technology where the charge pump current is always applied as lock state ICP, the new technology lock state (nominal ICP) and transition state (constant ICP) currents are applied as shown in FIG. 2 with the state machine algorithm shown in FIG. 3.

The improved circuit has a frequency smooth switching function with a lower and more controlled slew rate, faster operation and a lower gate count than conventional FTG products. The improved circuit uses fewer resources (less gate count) since the total gate count required for the state machine and the glue logic is less than the conventional comparator and Up/Down control circuit. The improved circuit has a linear transition and controlled slew rate since it uses a constant charge pump current through the higher capacitance of the loop filter after disabling the phase detector. The value of the constant current can be programmed via SMBUS, in accordance with the slew rate specification. The slew rate can be lower than the conventional solution using a closed loop with a minimum ICP proper for stability. Generally for high frequency PLLs, even this ICP causes a high slew rate as well.

The improved frequency smooth switching method described, is used to perform smooth transition of the output frequency, which is particularly useful when configurable frequency (known as 'dial-a-frequency') is performed and when spread spectrum profiles are enabled. In the improved method, the M and N counter updates are monitored, and the direction of the new frequency request (faster-slower) is decided depending on the time-out order of the M or N divider. This is done by-passing the loop by disabling the phase frequency detector (PFD) and performing linear up or down variation on the control voltage Vctrl (e.g., of the VCO) to achieve the target frequency. Once the time-outs are close enough (that means the loop is almost locked to the target frequency) the loop is closed and PLL operates at normal (lock state) conditions.

FIG. 3 shows the operation of the improved state machine (SM) 300 used to control frequency transitions. In the improved design, the state machine is used, instead of the comparator and up/down (UD) counter of the conventional solution, together with the new charge pump current application shown in FIG. 2. In the conventional solution, the counter priorities as well as step-by-step variations are controlled and performed by comparator and U/D control circuit.

In the improved solution, the state machine 300 is used to perform these operations. Apart from that in the new method the loop is disabled by disabling the phase detector (PD) and instead of phase detector generated UP or DWM signals, the state machine effectively decides the direction for frequency change and applies the correspondingly appropriate constant UP/DOWN signals (in this case constant ICP through or from the C1 to reduce or increase the Vctrl of the VCO) until the loop is sufficiently close to the target frequency.

The improved circuit and method replace the conventional up-down control circuits of the M and N counters with a state machine that in block 302 synchronizes the counters' loading, detects target frequency direction as well as lock state and finalizes the smooth frequency transition. In the improved circuit and method the feedback loop is by-passed during transition and a constant charge pump current is applied to the larger cap of the loop filter.

In one embodiment, the value of the constant current and thus the slew rate is programmable via SMBUS. In another embodiment, a new frequency request can be handled in the middle of the transition via state machine. In an alternate embodiment, the reduced slew rate may be achieved by reducing the charge pump current in the previous configuration without disabling the phase detector and applying the charge pump current as the nominal one shown in the FIG. 2. However in this alternate embodiment the frequency rollover risk increases since the loop is closed and very low bandwidth is caused by very low ICP. A common rule of thumb is that the sampling frequency should be less than one hundred times the BW. According to this rule of thumb, if the BW is less than 1% of the sampling frequency (Fref/M) the loop tends to increase the phase error at each pulse of sampling clock (Fref/M). When the phase error is higher than the period of the sampling clock then rollover occurs, which is very undesirable.

Advantages of improved circuit and method include that the direction of the transition is detected at the beginning of transition. As a result there is no extra down transition, rather a one-way transition to the target frequency. A further advantage is that there is a linear transition to the target frequency via bypassing the loop and applying constant current to the larger capacitor of the loop filter. Another advantage is that the slew rate may be controlled via programmability of the constant charge pump current via SMBUS. Another advantage is that the lock detect circuit operates by means of detecting the time-out order of the M (reference) and N (feedback) counters. Yet another advantage is that there is a reduced gate count requirement since there is no need to check the new M (reference divider) and N (feedback divider) values and perform step-by-step variation (that may also cause extra down transitions).

In block 301, the state machine receives a new M and/or N value request. In block 302, the state machine synchronizes M/N loading. In block 303, the M/N counter's time-out order is monitored and the PD disabled. In block 304, it is determined whether the timeouts differ. If not, then in block 305 the state machine status word (SMSW) function is completed. If so, then in block 306, it is determined whether the N counter times out first.

If the N counter times out first, then in block 317, a constant ICP is provided for the down direction. In block 318, it is determined whether there is a new M/N request. If so, block 302 is repeated. If not, it is determined whether the M counter times out first. If not, block 317 is repeated.

If the N counter does not time out first, then in block 307, a constant ICP is provided for the up direction. In block 308, it is determined whether there is a new M/N request. If so, block 302 is repeated. If not, it is determined whether the N counter times out first. If not, block 307 is repeated.

If it is determined in block 309 that the N counter times out first, or in block 319 that the M counter times out first, then in block 310, the PD is enabled and the ICP changed to three times the constant charge pump current ICP_C value for a period of five times the address counter period. In block 320, the SMSW function is completed.

Figure 4:
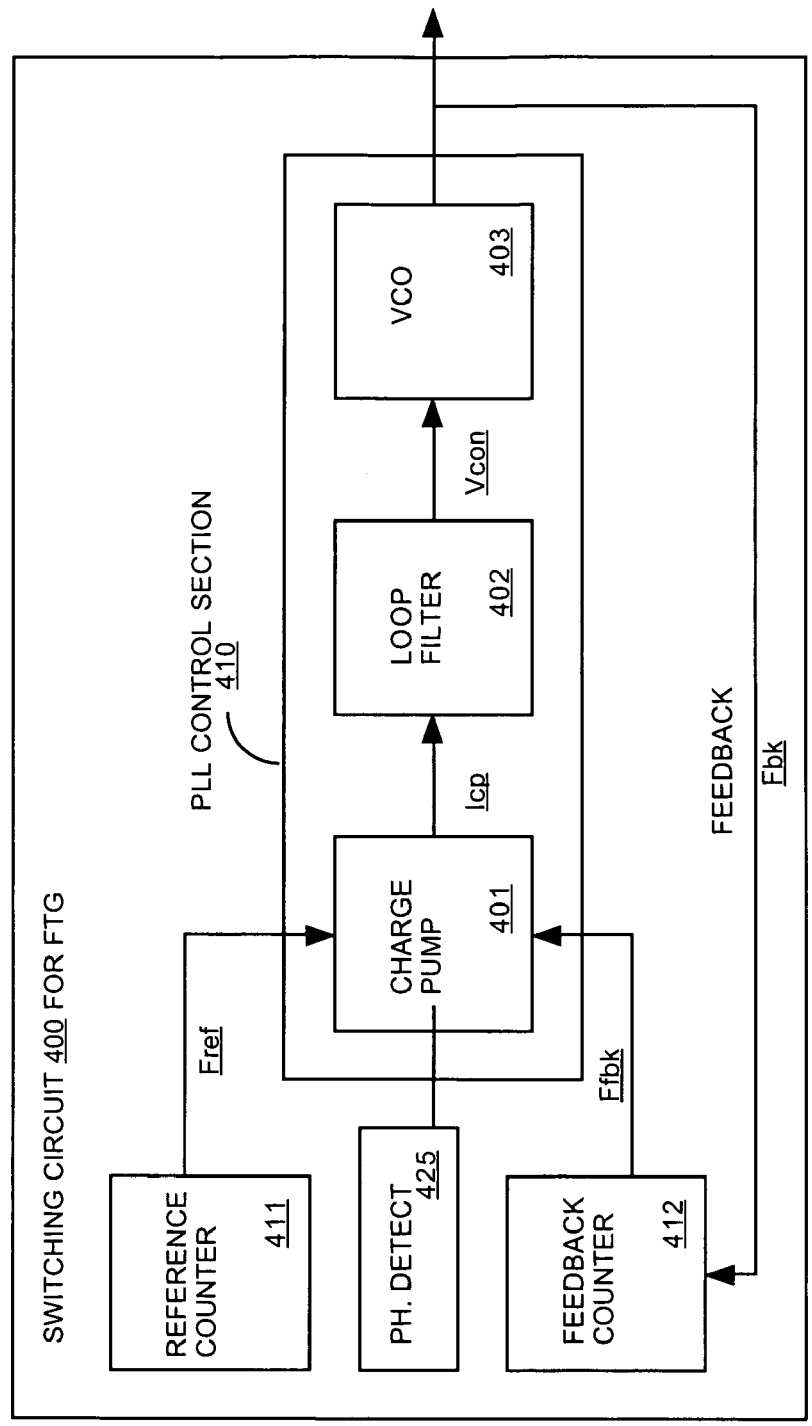
FIG. 4 depicts a frequency switching circuit for frequency timing generators, according to an embodiment of the present invention.

FIG. 4 depicts a frequency switching circuit 400 for frequency timing generators, according to an embodiment of the present invention. Circuit 400 has a phase locked loop (PLL) control section 410. PLL control section 410 has a charge pump 401. A loop filter 402 is coupled to receive charge pump current Icp from the charge pump 401. A voltage controlled oscillator (VCO) 403 is coupled to receive a control voltage Vcon from the loop filter 402. Circuit 400 also has a reference counter 411 and a feedback counter 412.

The reference counter 411 provides a reference frequency Fref input to the charge pump 401. The feedback counter 412 provide a feedback frequency Ffbk input to the charge pump 401. In one embodiment, the feedback frequency input Ffbk is based on feedback Fbk from the output of PLL control section 410. A requested frequency change direction in the phase locked loop control section 410 is determined based upon a time-out order of the feedback counter 412 and the reference counter 411.

Loop filter 402 is effectively bypassed with application of a constant value of charge pump current Icp to a node thereof. Upon detecting a lock on the requested frequency, a lock state associated with the phase locked loop control system 410 is determined. In one embodiment, upon determining the time-out order wherein a time-out order difference is detected therein, a determination is made as to which of reference counter 411 and feedback counter 412 times out first.

Upon determining that reference counter 411 times out first, the constant charge pump current Icp is delivered to the node of the loop filter 402 to achieve an upward frequency direction. Upon determining that the feedback counter 412 times out first, the constant charge pump current Icp is delivered to the node of the loop filter 402 to achieve a downward frequency direction.

In one embodiment, the loop filter 402 includes a resistance and a first capacitance in series with the resistance to form a first leg of a resistance/capacitance network, as shown for example in FIG. 2. Also as shown in FIG. 2, in one embodiment, a second capacitance is in parallel with the first leg of resistance/capacitance network. In one embodiment, the loop filter is effectively bypassed with inputting of the constant charge pump current Icp to a node between the resistance and the first capacitance in the first leg of the resistive/capacitive network. In one embodiment, the first capacitance has a value that is higher than the second capacitance.

In one embodiment, a lock state associated with the phase locked loop control section 410 is determined with a state machine status word function. In one embodiment, a phase detector 425 coupled to the charge pump 401 is enabled, the charge pump current Icp is changed, and the state machine status word function is ended upon providing the constant charge pump current Icp and determining the time-out order of the feedback counter 411 and the reference counter 412.

Embodiments of the present invention are well suited to performing various other steps or variations of the steps recited herein, and in a sequence other than that depicted and/or described herein. In one embodiment, such a process is carried out by processors and other electrical and electronic components, e.g., executing computer readable and computer executable instructions comprising code contained in a computer usable medium.

For purposes of clarity, many of the details of (subject matter) and the methods of designing and manufacturing the same that are widely known and are not relevant to the present invention have been omitted from the following description. It should be appreciated that reference throughout this specification to "one embodiment" or "an embodiment" means that a particular feature, structure or characteristic described in connection with the embodiment is included in at least one embodiment of the present invention.

Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Embodiments of the present invention, a circuit, system and method for performing smooth switching in a frequency timing generator, are thus described. While the present invention has been described in particular embodiments, it should be appreciated that the present invention should not be construed as limited by such embodiments, but rather construed according to the following claims.

What is claimed is:

1. A method for performing switching in a frequency timing generator, comprising:

detecting a request for a new value for at least one of a feedback counter or a reference counter;

upon said detecting, synchronizing a loading operation for said counter for which a new value is requested;

determining a time-out order of said feedback counter and said reference counter and provided no difference therein, completing a state machine status word function;

upon a difference is detected therein, determining which of said reference counter and said feedback counter times out first;

provided said reference counter times out first, delivering a constant charge pump current to a loop filter associated with a phase locked loop to achieve an upward frequency direction; and provided said feedback counter times out first, delivering a constant charge pump current to said loop filter to achieve a downward frequency direction.

2. The method as recited in claim 1 further comprising:
upon providing said constant charge pump current, determining said time-out order of said feedback counter and said reference counter;
enabling a phase detector;
changing said charge pump current; and
ending said state machine status word function.

3. The method as recited in claim 1 wherein said constant charge pump current is provided to a node between a resistance and a first capacitance that are arranged together in series, wherein said resistance and first capacitance in series are in parallel with a second capacitance to form a resistive/capacitive network.

4. The method as recited in claim 3 wherein said loop filter comprises said capacitive/capacitive network.

5. The method as recited in claim 3 wherein a nominal charge pump current is provided to said capacitive/capacitive network at a node between said first resistance and said second capacitance.

6. The method as recited in claim 5 wherein said constant charge pump current effectively bypasses said loop filter with respect to said nominal charge pump current.

7. The method as recited in claim 3 wherein said first capacitance has a capacitance value that is higher than said second capacitance.

8. A method for controlling frequency slewing in a phase locked loop system, comprising:
determining a requested frequency change direction in said phase locked loop;
opening said phase locked loop system by disabling a phase detector of said phase locked loop system by delivering a constant charge pump current; and
upon detecting a lock on said requested frequency, determining a lock state associated with said phase locked loop system, wherein said determining a requested frequency change direction comprises determining a time-out order of a feedback counter and a reference counter associated with said phase locked loop system.

9. The method as recited in claim 8 wherein said opening said phase locked loop system comprises inputting said constant charge pump current to a node between a resistance and a first capacitance that are arranged together in series, wherein said resistance and first capacitance in series are in parallel with a second capacitance to form a capacitive/capacitive network.

10. The method as recited in claim 9 wherein said first capacitance has a value that is higher than said second capacitance.

11. The method as recited in claim 8 wherein said determining a lock state associated with said phase locked loop system comprises determining a state machine status word function.

12. A circuit for performing switching in a frequency timing generator, comprising:
a phase locked loop control section comprising:
a charge pump;
a loop filter coupled to receive charge pump current from said charge pump; and
a voltage controlled oscillator coupled to receive a control voltage from said loop filter;
a reference counter for providing a reference frequency input to said charge pump; and
a feedback counter for providing a feedback frequency input to said charge pump, wherein a requested frequency change direction in said phase locked loop control section is determined based upon a time-out order of said feedback counter and said reference counter, wherein said phase locked loop system is opened with application of a constant charge pump current to a node thereof and wherein, upon detecting a lock on said requested frequency, a lock state associated with said phase locked loop system is determined.

13. The circuit as recited in claim 12 wherein, upon said determining said time-out order wherein a time-out order difference is detected therein, a determination is made as to which of said reference counter and said feedback counter times out first.

14. The circuit as recited in claim 13 wherein, upon determining that said reference counter times out first, said constant charge pump current is delivered to said loop filter to achieve an upward frequency direction.

15. The circuit as recited in claim 13 wherein, upon determining that said feedback counter times out first, said constant charge pump current is delivered to said loop filter to achieve a downward frequency direction.

16. The circuit as recited in claim 12 wherein said loop filter comprises:
a resistance;
a first capacitance in series with said resistance to form a first leg of a resistance/capacitance network; and
a second capacitance in parallel with said first leg of a capacitance/capacitance network, wherein said phase locked loop system is opened with an input of said constant charge pump current to a node between a resistance and a first capacitance.

17. The circuit as recited in claim 16 wherein said first capacitance has a value that is higher than said second capacitance.

18. The circuit as recited in claim 12 wherein said lock state associated with said phase locked loop is determined with a state machine status word function.

19. The circuit as recited in claim 18 wherein a phase detector coupled to said charge pump is enabled, said charge pump current is changed, and said state machine status word function is ended upon providing said constant charge pump current and determining said time-out order of said feedback counter and said reference counter.

* * * * *